(12) United States Patent
Tong et al.

(10) Patent No.: US 6,875,683 B2
(45) Date of Patent: Apr. 5, 2005

(54) METHOD OF FORMING BUMP

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW)

(73) Assignee: Advanced Semiconductor Engineering, Inc., Raohsiung (TW)

( * ) Notice: Subject to any disclaimer, the term of this patent is extended or adjusted under 35 U.S.C. 154(b) by 6 days.

(21) Appl. No.: 10/063,576

(22) Filed: May 3, 2002

(65) Prior Publication Data

US 2003/0157790 A1 Aug. 21, 2003

(30) Foreign Application Priority Data

Feb. 21, 2002 (TW) ........................................ 91102990 A

(51) Int. Cl.⁷ .............................................. H01L 21/44
(52) U.S. Cl. ........................ 438/617; 438/613; 438/614
(58) Field of Search ................................ 438/617, 612, 438/613, 614, 615; 228/179.1, 180.1, 180.21, 180.22, 180.5

(56) References Cited

U.S. PATENT DOCUMENTS 5,903,058 A * 5/1999 Akram ........................ 257/778
6,181,569 B1 * 1/2001 Chakravorty ................ 361/761
6,475,897 B1 * 11/2002 Hosaka ........................ 438/617

FOREIGN PATENT DOCUMENTS

JP          08-213399        *   8/1996

* cited by examiner

Primary Examiner—Carl Whitehead, Jr.
Assistant Examiner—Thanhha Pham
(74) Attorney, Agent, or Firm—Jianq Chyun IP Office

(57) ABSTRACT

A method of forming a bump on an active surface of a wafer is disclosed. The method of the invention forms an under ball metallurgy (UBM) onto the active surface of the wafer. Then, the UBM is partially removed until a portion of the active surface of the wafer is exposed. At least one conductive stud is bonded onto the non-removed UBM by wire bonding.

29 Claims, 7 Drawing Sheets

METHOD OF FORMING BUMP

CROSS REFERENCE TO RELATED APPLICATIONS

This application claims the priority benefit of Taiwan application Ser. No. 91102990, filed Feb. 21, 2002.

BACKGROUND OF INVENTION

1. Field of the Invention

The present invention relates to a method of forming a bump. More specifically, the invention relates to a method of forming a bump that has a substantial composition and a well-controlled height.

2. Description of the Related Art

Electronic products containing integrated circuits play an important rolein our daily life. In order to meet the demand for user-friendly electronic products of compactness and multifunction, higher and higher integration of semiconductor devices are necessary and packages thereof are accordingly smaller and smaller. A flip chip package technology has been proposed and widely used to achieve the above-mentioned requirements. In the flip chip package technology, a bump is formed on a bonding pad of a chip. The bump serves to electrically connect the bump to a substrate. Compared to a conventional wire bonding and tape automatic bonding, a circuit path needed for the flip chip package technology is shorter and therefore its electric properties are superior. In some flip chip type packages, a backside of the chip is externally exposed to further improve heat dissipation.

FIGS. 1–7 are schematic views showing a conventional method of forming a bump on a bump pad of a wafer.

In FIG. 1, a wafer 110 having an active surface 112 is provided. A passivation layer 114 and at least one bonding pad 116 exposed by the passivation layer 114 are formed on the active surface 112 of the wafer 110.

In FIG. 2, an adhesive layer 120 is formed over the active surface 112 of the wafer 110 by sputtering to cover the bonding pad 116 and the passivation layer 114. A barrier layer 130 is formed, preferably conformally, on the adhesive layer 120 by sputtering or plating. Then, a wettable layer 140 is formed on the barrier layer 130 by sputtering or plating. An under ball metallurgy (UBM) consisting of the adhesive layer 120, the barrier layer 130 and the wettable layer 140 is thus accomplished.

In FIG. 3, the UBM is subject to a photolithography process. First, a photoresist 150 is formed on the wettable layer 140, and defined by exposure/development to form least an opening 152 in the photoresist 150. The opening 152 exposes a portion of the wettable layer 140 above the bonding pad 116.

In FIG. 4, a conductive material is filled into the opening 152 to form a conductive stud 160. The conductive stud 160 covers the exposed portion of the wettable layer 140.

In FIG. 5, the photoresist 150 is removed by a conventional removing process until the UBM 142 beneath the photoresist 150 is exposed. The exposed UBM 142 is subsequently removed by etching to expose the passivation layer 114 thereunder, as shown in FIG. 6. Only the portion of the UBM 142 beneath the conductive stud 160 exists.

In FIG. 7, a reflow process is performed to melt and reform the conductive stud 160 into a ball-shaped bump 170. The bump 170 consists of the UBM 142 and conductive stud 160.

In FIG. 1 to FIG. 7, the conductive stud 160 is formed in the opening 152 of the photoresist by plating. The composition ratio of the conductive stud 160 formed by plating can not be precisely controlled, especially in the case of forming the conductive stud with high lead or no lead content. In the case of forming the leadless conductive stud, tin silver alloy, tin silver copper alloy or tin silver bismuth alloy is used as the material to form the leadless conductive stud. However, it is difficult to control a plating liquid with a constant composition.

SUMMARY OF INVENTION

It is one object of the invention to provide a bump forming process, in which a ratio of solder composition in a conductive stud can be well controlled and bumps with uniform height can be formed.

It is another object of the invention to provide a bump forming process to form bumps with very small pitch there between.

It is still another object of the invention to provide a bump forming process, in which an under ball metallurgy (UBM) is formed on a bonding pad of a wafer, and a conductive stud is planted onto the UBM by wire bonding to form a bump. Thereby, metal particles inside the bump are prevented from diffusing into the wafer.

It is still another object of the invention to provide a leadless bump forming process, in which an under ball metallurgy (UBM) is formed on a bonding pad of a wafer, and a conductive stud is planted onto the UBM by wire bonding to form a bump.

Here, if A is described to be located "on" B, it means A is directly located on and in contact with B, or A is located above B within a certain distance from B.

In order to achieve the above and other objectives of the invention, a bump forming process is provided. A wafer having an active surface is provided. A passivation layer and at least one bonding pad exposed by the passivation layer are formed on the active surface of the wafer. In the process of the invention, an adhesive layer is formed on the active surface of the wafer to cover the bonding pad and the passivation layer. A barrier layer and a wettable layer are sequentially formed on the adhesive layer. A photomask with predetermined patterns is formed on the wettable layer by photolithography process, exposing a portion of the wettable layer where is not covered by the photomask pattern. The exposed portion of the wettable layer, along with the barrier layer and the adhesive layer under the exposed wettable layer, is then removed by etching to form an under ball metallurgy (UBM). After removing the photomask pattern, at least one conductive stud is bonded onto the wettable layer by wire bonding. The material for the conductive stud can be tin/lead alloy, leadless alloy or pure tin. A reflow process is performed to shape the wire bond into a ball-shaped bump.

In one aspect of the invention, the material for the adhesive layer can be titanium, titanium tungsten alloy, aluminum, or chromium, for example. The material for the barrier layer can be nickel vanadium alloy, chromium copper alloy, or nickel, for example. The material for the wettable layer can be copper, palladium, or gold.

After the conductive stud is bonded onto the wettable layer and before the reflow process is performed, a polishing process can be further performed to smoothe a top profile of the wire bond.

In the present invention, the conductive stud is bonded onto the UBM by wire bonding using a wire bonding machine. The material for making the conductive stud is the material of the wire filled in a bonding head of the wire bonding machine. In general, the wire filled in the bonding head of the wire bonding machine has a uniform composition. Therefore, the conductive stud formed of the wire has substantially the same phase change during reflow, which can form a bump with well-controlled height. Furthermore, with use of wire bonding, a bump with very small pitch can be formed. The wettable layer can be formed of a material which can be congruent with the conductive stud, so that the conductive stud is tightly fixed to the wafer. The material of the UBM is determined based on the material of the conductive stud in order to increase the bonding between the conductive stud and the wafer. The UBM can further prevent metal particles of the conductive stud from entering the wafer and thus prevent wafer failure because of diffusion of the metal particles into the wafer.

BRIEF DESCRIPTION OF DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DETAILED DESCRIPTION

Figure 1:
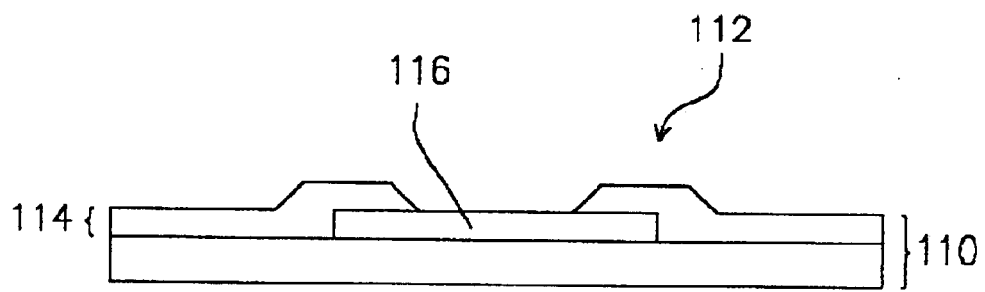
FIGS. 1–7 are schematic views showing a conventional bump forming process.
Figure 2:
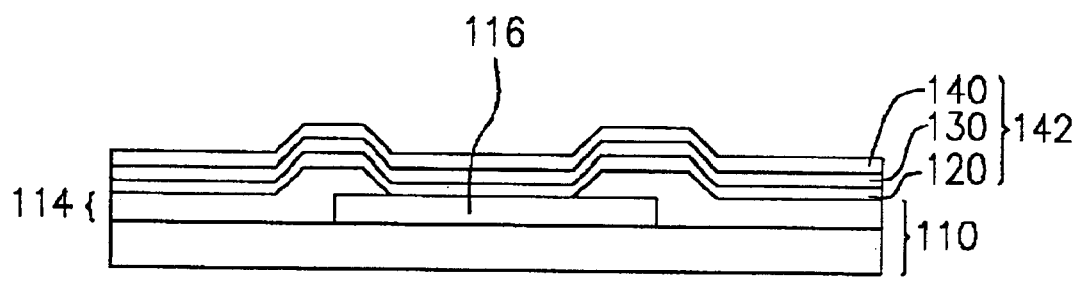
Figure 3:
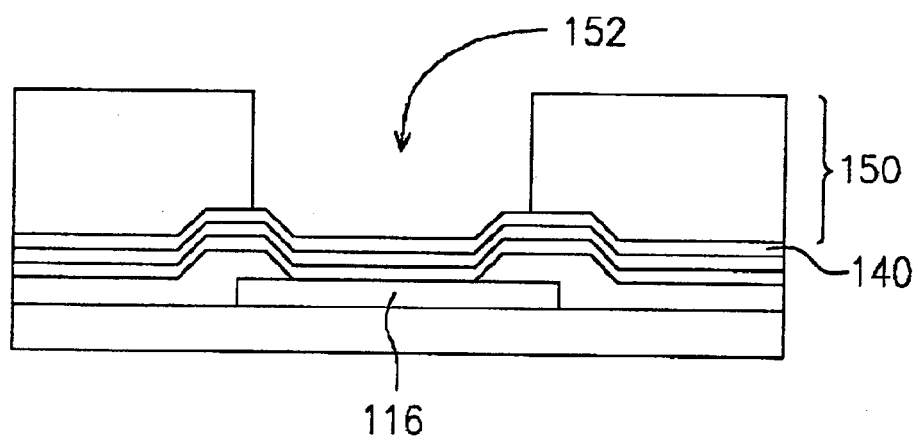
Figure 4:
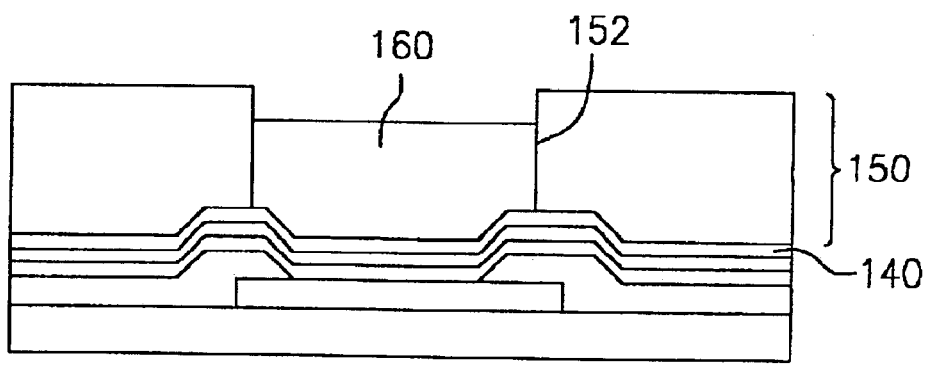
Figure 5:
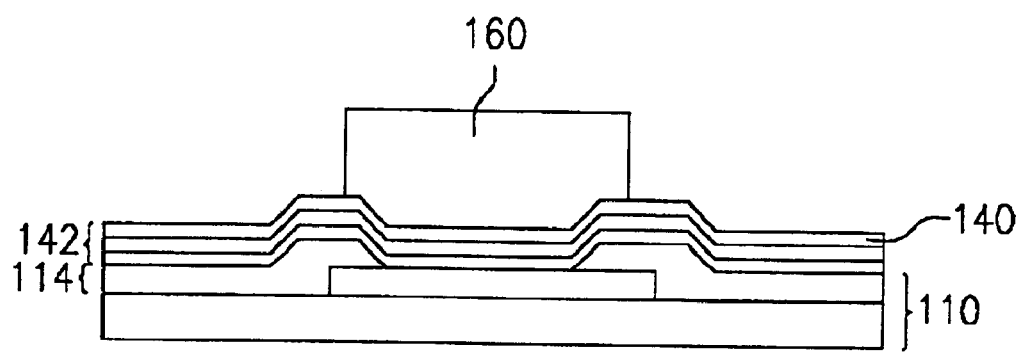
Figure 6:
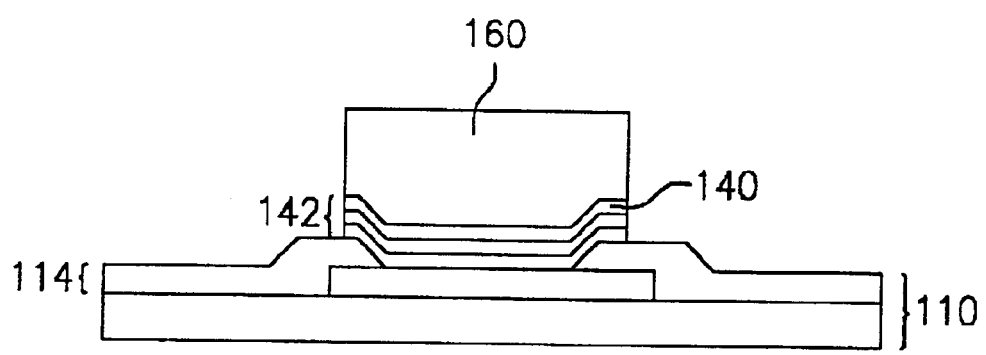
Figure 7:
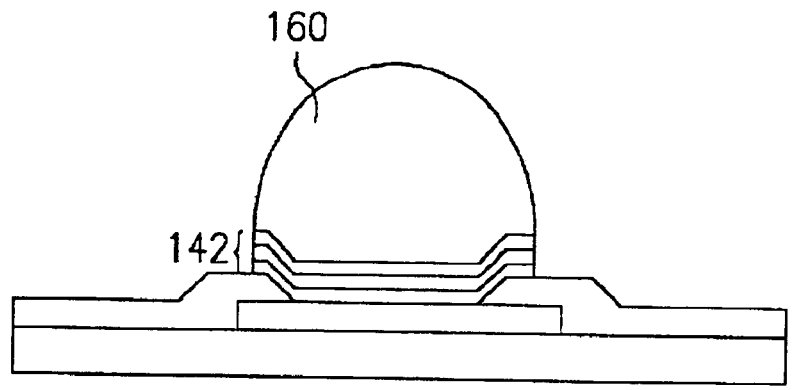

Reference will now be made in detail to the present preferred embodiments of the invention, examples of which are illustrated in the accompanying drawings. Whenever possible, the same reference numbers are used in the drawings and the description to refer to the same or like parts.

Figure 8:
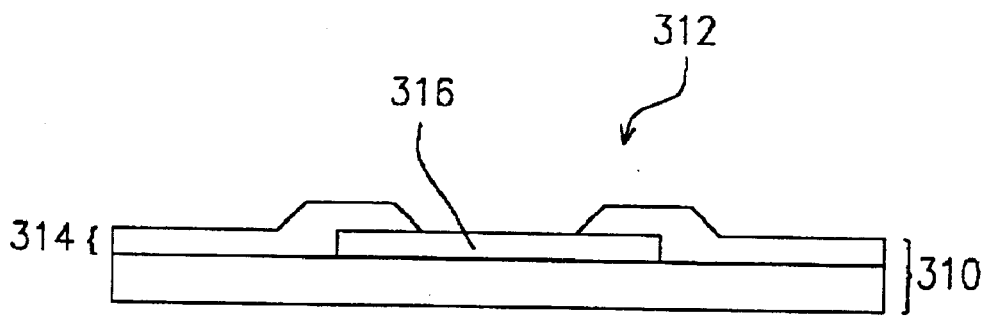
FIGS. 8–18 are schematic views showing a bump forming process according to one preferred embodiment of the invention.
Figure 9:
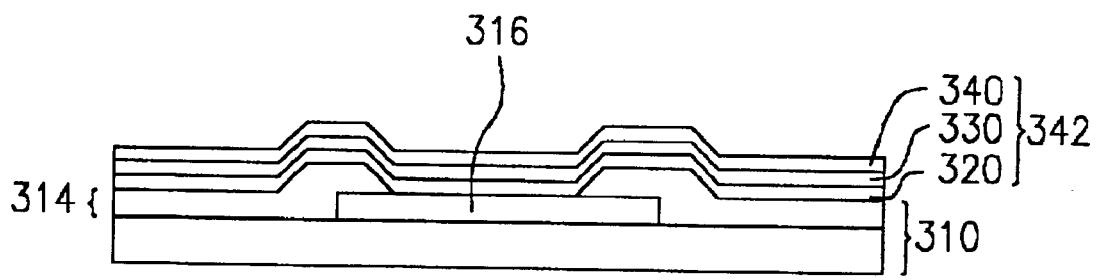

FIGS. 8–18 are schematic views showing a bump forming process according to one preferred embodiment of the invention. FIG. 8 shows a wafer 310 having an active surface 312. A passivation layer 314 and at least one bonding pad 316 exposed by the passivation layer 214 are formed on the active surface 312. An adhesive layer 320 covers the bonding pad 316 and the passivation layer 314. The adhesive layer 320 can be formed of titanium, titanium tungsten alloy, aluminum, or chromium. A barrier layer 330 is formed on the adhesive layer 320 by sputtering or plating. The barrier layer 330 can be formed of nickel vanadium alloy, chromium copper alloy, or nickel. A wettable layer 340 is formed on the barrier layer 330 by sputtering or plating. The wettable layer 340 can be formed of copper, palladium, or gold. An under ball metallurgy (UBM) is thus accomplished. The UBM 342 includes the adhesive layer 320, the barrier layer 330 and the wettable layer 340.

Figure 10:
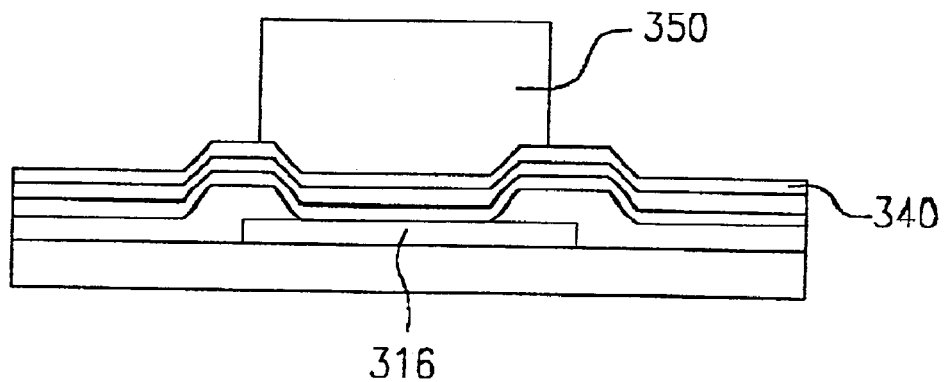

With reference to FIG. 10, a photomask with a predetermined pattern 350 is formed on the wettable layer 340 by photolithography process, exposing the wettable layer 340 where it is not covered by the photomask pattern 350.

Figure 11:
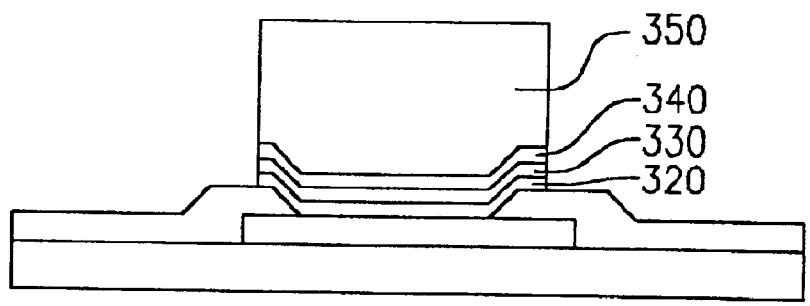
Figure 12:
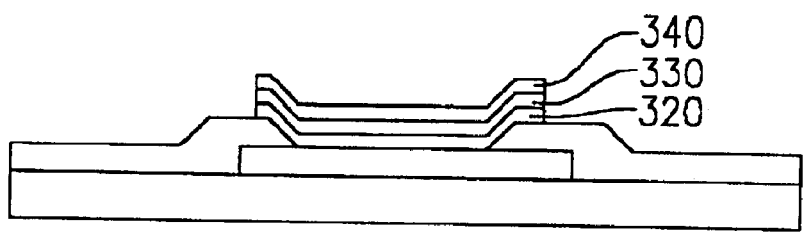

With reference to FIG. 11, the exposed portion of the wettable layer 340, along with the barrier layer 330 and the adhesive layer 320 under the exposed portion of the wettable layer 340, is then removed by etching to form an under ball metallurgy (UBM). The photomask pattern 350 is removed, as shown in FIG. 12.

Figure 13:
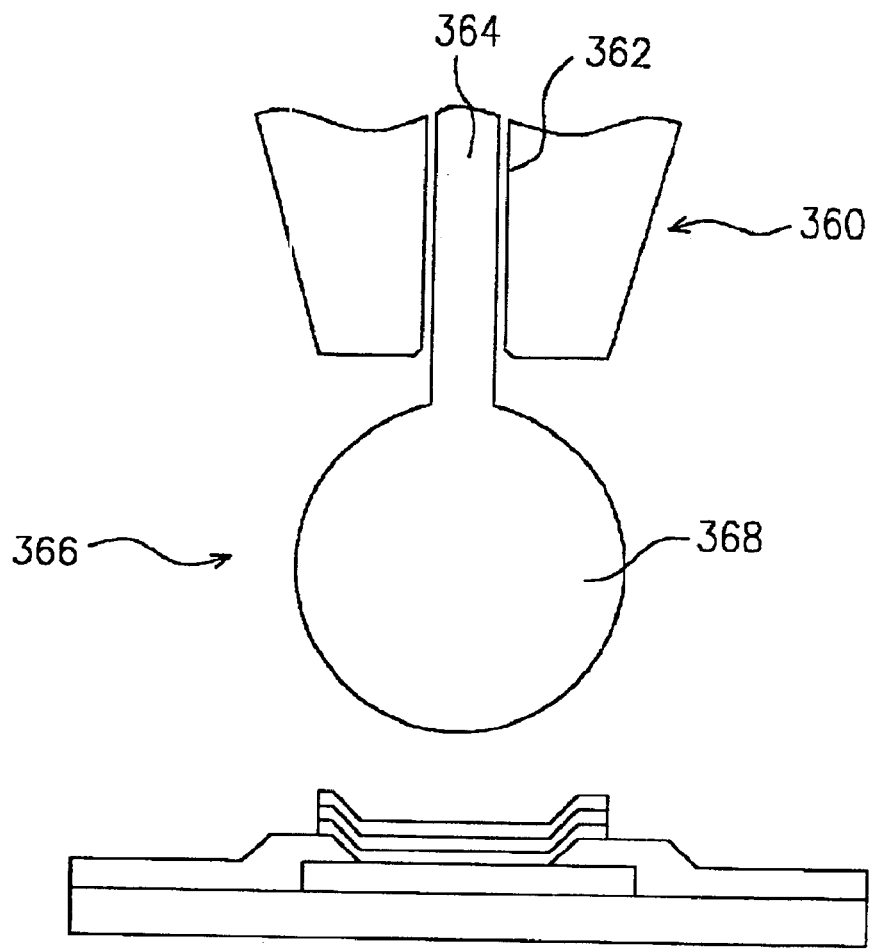

In FIG. 13, after removing the photomask pattern 350, at least one conductive stud is bonded onto the wettable layer 340 by wire bonding using a conventional wire bonding machine. The wire bonding machine is provided with a bonding head 360 that has a capillary 362 to contain a wire 364. The wire 364 slides along the capillary 362 and melts at one end 366 once subject to a high temperature by point discharging. The melted end 366 of the wire 364 forms a ball 368 by the cohesion action between metal ions. During the point discharging, a flow of inert gas is needed to prevent the high-temperature conductive stud 368 from being oxidized.

Figure 14:
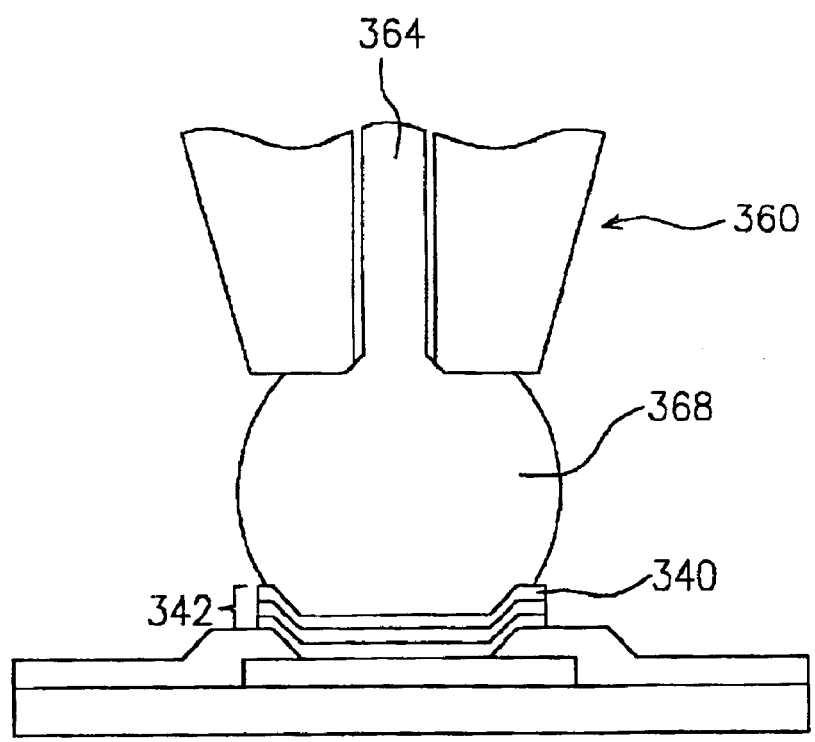
Figure 15:
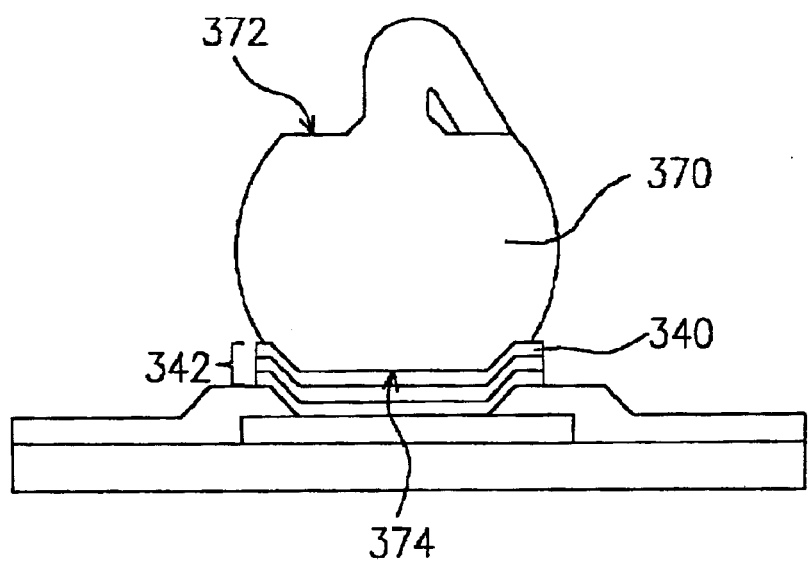
Figure 16:
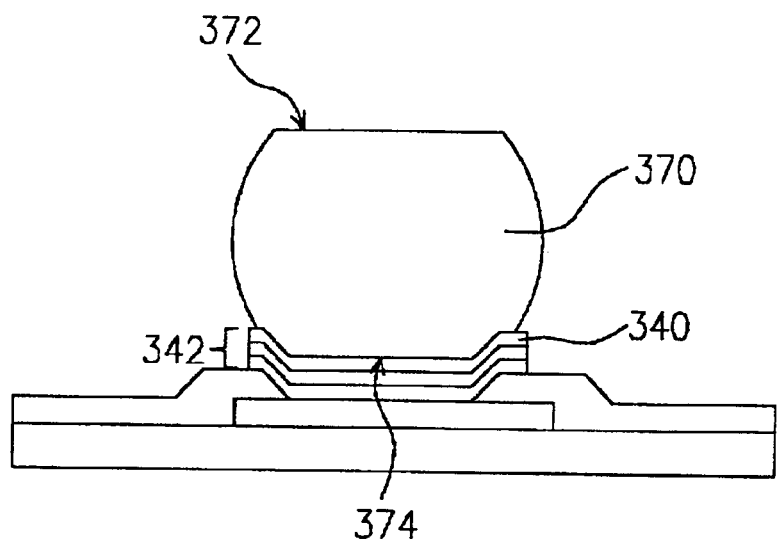

With reference to FIG. 14, the ball 368 is bonded to the wettable layer 340 before becoming solidified. An ultrasonic wave is further applied to the junction between of the ball 368 and the wettable layer 340 to make the ball 368 and the wettable layer 340 congruent. Thereby, the ball 368 is tightly bonded to the UBM 342. Then, the bonding head 360 is risen to separate the wire 364 from the ball 368, as shown in FIG. 15. A conductive stud 370 is thus formed. The conductive stud 370 has a top surface 372, and a bottom surface 374 that contacts the wettable layer 340. The material for the conductive stud 374 can be tin/lead alloy. The tin/lead alloy can contain expensive low-α particles. Tin/lead alloys with various ratios of tin and lead, such as 97Pb/3Sn, 95Pb/5Sn, or 63Sn/37Pb can be used in the invention to obtain the conductive stud 370. However, the conductive stud 370 can be also be formed of leadless alloy, such as tin copper alloy, tin silver alloy, tin magnesium alloy, tin zinc alloy, indium silver alloy, tin bismuth alloy, tin indium alloy, or bismuth indium alloy. Pure tin can be used to form the conductive stud 370, as well. A polishing or stamping process is optionally performed to flatten a topography 372 of the conductive stud 370, as shown in FIG. 16. With the use of the polishing or stamping process, a volume of the conductive stud 370 on the UBM 342 can be controlled. As recited above, the volume of the conductive stud 370 can be controlled more precisely by means of controlling the volume of the ball 368 supplied by the wire bonding machine and determining the amount of the polished conductive stud 370.

Figure 17:
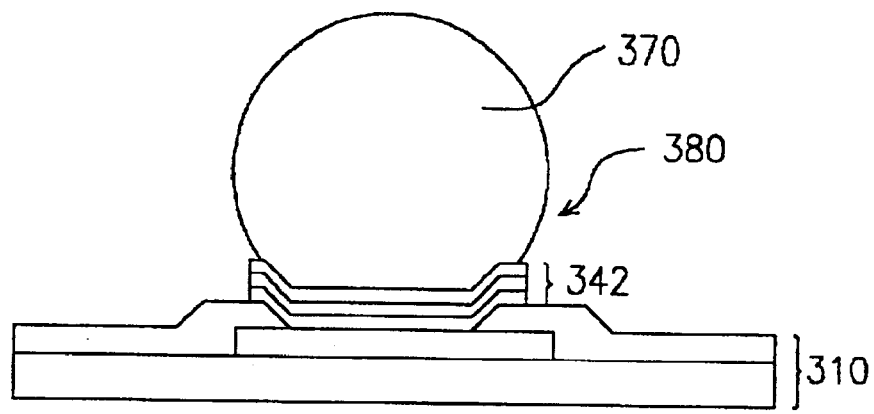
Figure 18:
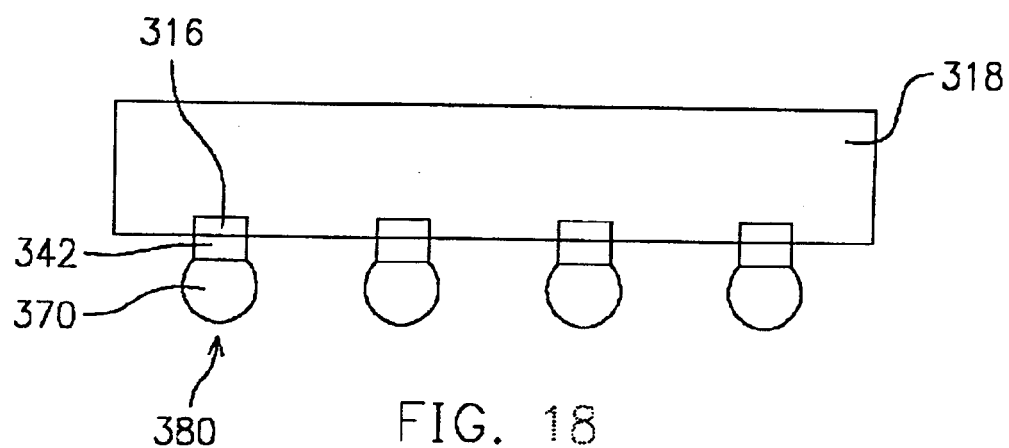

With reference to FIG. 17, a reflow process is performed to make the wire bond into at least a ball-shaped bump. A flux is applied onto the conductive stud. The conductive stud 370 is melted and forms a ball after being subjected to a high temperature. If the conductive stud 370 is a tin lead alloy of 95Pb/5Sn, then the temperature for the reflow process is above 315° C. If the conductive stud 370 is a tin silver alloy of 96.5Sn/3.5Ag, then the temperature for the reflow process is above 221° C. A bump 380 consisting of the UBM 342 and the conductive stud 370 is thus formed. Subsequently, the wafer is sawed into a plurality of chips 318, as shown in FIG. 18.

Alternatively, the conductive stud is bonded onto the UBM after die sawing. Furthermore, when the conductive stud bonded onto the UBM is so small that the reflow process is performed without polishing, the conductive stud can be bonded onto the UBM immediately after the UBM is formed. In this case, the conductive stud is used as an etching mask to define the UBM. Compared to the above method, the photolithography process can be omitted in this case.

With reference to FIGS. 8–18, in the method of the invention, the conductive stud 370 is bonded onto the UBM by wire bonding using a wire bonding machine. The material for making the conductive stud is the wire 364 filled in a bonding head of the wire bonding machine. In general, the wire filled in the bonding head of the wire bonding machine has a uniform composition. Therefore, the conductive stud 370 formed from the wire has substantially the same phase change during reflow, which can form a bump 380 with well-controlled height. Besides, the conductive stud 370 with uniform composition would not collapse during reflow. A minimum pitch between bumps formed by the method of the invention can be about 40 micron.

Furthermore, with the use of wire bonding, a bump with very small pitch can be formed. The wettable layer can be formed of a material which can be congruent with the conductive stud, so that the conductive stud is tightly fixed to the wafer. The material of the UBM is determined based on the material of the conductive stud in order to increase the bonding between the conductive stud and the wafer. The UBM can further prevent metal particles of the conductive stud from entering the wafer and thus prevent wafer failure because of diffusion of the metal particles into the wafer.

Although the specific examples of the material for the UBM are described in the embodiment of the invention, other materials that have been used to form the UBM in the art can be used in the invention.

The embodiment of the invention specifically describes that the UBM consists of three layers, the adhesive layer, the barrier layer and the wettable layer, but the number of the layers that form the UBM is not limited to three. For example, four conductive layers of chromium/chromium copper alloy/copper/silver can form the UBM. Two conductive layers can also form the UBM, in which a lower metal layer is made of titanium tungsten alloy or titanium, and an upper metal layer is made of copper, nickel or gold.

Furthermore, the bump formed by the method of the invention is not limited to be formed directly on an active surface of the wafer. If needed, a redistribution layer is formed on the wafer and then the bump is formed on the redistribution layer.

In view of foregoing, the invention provides the following advantages over the prior art:

1. The bump is formed by wire bonding a conductive stud on the UBM. Because the conductive stud is made of a wire that has a highly uniform composition, the conductive stud bonded onto the UBM has a substantial uniform phase change during reflow. Therefore, it is easy to control the height of the bump.

2. A pitch between the bumps formed by wire bonding is up to about 40 micron, which is very small with respect to the current technology.

3. A leadless bump can be obtained according to the method of the invention to reduce environmental pollution.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A method of forming a bump on a wafer, wherein the wafer has an active surface, and the active surface is provided with a passivation layer and a bonding pad exposed by the passivation layer, the method comprising:

forming an adhesive layer on the active surface of the wafer to cover the bonding pad and the passivation layer;

forming a barrier layer on the adhesive layer;

forming a wettable layer on the burner layer;

forming a photomask on the wettable layer by a photolithography process, wherein the photomask exposes a portion of the wettable layer;

removing the exposed wettable and sequentially the barrier layer and the adhesive layer thereunder by etching, until the active surface of the wafer is exposed;

removing the photomask;

bonding a plurality of conductive studs onto the wettable layer by wire bonding, wherein the conductive stud is made of a material selected from tin/lead alloy, leadless alloy and pure tin, and each conductive stud has a top surface and a bottom surface opposite to the top surface, the bottom surface being in contact with the wettable layer and the top surface being flattened by polishing, so that the top surfaces of the conductive studs are coplanar; and performing a reflow process to form a plurality of ball-shaped bumps.

2. The method of claim 1, wherein the adhesive layer is formed of titanium, titanium tungsten alloy, aluminum and chromium.

3. The method of claim 1, wherein the barrier layer is formed of a material selected from a group consisting of nickel vanadium alloy, chromium copper alloy, and nickel.

4. The method of claim 1, wherein the wettable layer is formed of a material selected from a group consisting of copper, palladium, and gold.

5. The method of claim 1, wherein the conductive stud is formed of a material selected from tin lead alloy with high lead percentage of more than 90%.

6. The method of claim 1 wherein the conductive stud is formed of a material selected from tin copper alloy, tin silver alloy, tin magnesium alloy, tin zinc alloy, indium silver alloy, tin bismuth alloy, tin indium alloy, and bismuth indium alloy.

7. The method of claim 1, wherein the step of bonding the conductive stud onto the wettable layer comprises:

providing a wire;

melting one tip end of the wire to form a ball;

pressing die ball onto the wettable layer; and separating the ball from the wire to form the conductive stud on the wettable layer.

8. The method of claim 7, wherein the ball is pressed onto the wettable layer while applying ultrasonic wave.

9. A method of forming a bump on an active surface of a wafer, the method comprising:

forming an under ball metallurgy (UBM) on the active surface of the wafer;

forming a photomask on the VBM by photolithography to partially expose the UBM;

removing the exposed portion of the UBM by etching, until the active surface of the wafer is exposed;

removing the photomask;

bonding a plurality of conductive studs onto the UBM by wire bonding, wherein each conductive stud has a top surface and a bottom surface opposite to the top surface, the bottom surface being in contact with the UBM and the top surface is flattened by polishing so that the top surfaces of the conductive studs are coplanar; and performing a reflow process to form a plurality of ball-shaped bumps.

10. The method of claim 9, wherein the step of forming the UBM onto the active surface of the wafer comprises:

forming an adhesive layer on the active surface of the wafer;

forming a barrier layer on the adhesive layer; and forming a wettable layer on the barrier layer.

11. The method of claim 10, wherein the adhesive layer is formed of a material selected from a group of titanium, titanium tungsten alloy, aluminum, and chromium.

12. The method of claim 10, wherein the barrier layer is formed from a material selected from a group consisting of nickel vanadium alloy, chromium copper alloy, and nickel.

13. The method of claim 10, wherein the wettable layer is formed of a material selected from a group consisting of copper, palladium, and gold.

14. The method of claim 9, wherein the conductive stud is formed of leadless alloy.

15. The method of claim 9, wherein the conductive stud is formed of a material selected from a group consisting of tin copper alloy, tin silver alloy, tin magnesium alloy, tin sine alloy, indium silver alloy, tin bismuth alloy, tin indium alloy, bismuth indium alloy, and tin.

16. The method of claim 9, wherein the conductive stud is formed of tin lead alloy.

17. The method of claim 9, wherein the conductive stud is formed of tin lead alloy with high lead percentage of more than 90%.

18. The method of claim 9, wherein the step of bonding the conductive stud onto the UBM comprises:

providing a wire;

melting one tip end of the wire to farm a ball;

pressing the ball onto the wettable layer; and separating the ball from the wire to form the conductive stud on the wettable layer.

19. The method of claim 18, wherein the ball is pressed onto the wettable layer while applying ultrasonic wave.

20. A method of forming a bump on an active surface of a wafer, the method comprising:

forming a UBM on the active surface of the wafer;

bonding a plurality of conductive studs onto the UBM by wiring bonding, wherein each conductive stud has a top surface and a bottom surface opposite to the top surface, wherein the bottom surface is in contact with the UBM and the top surface is flattened by polishing for coplanarity after the conductive stud is bonded onto the UBM; and partially removing the UBM using the above conductive studs as masks until the active surface of the wafer is exposed.

21. The method of claim 20, further comprising a step of performing a reflow process to shape the conductive stud in the form of ball after partially removing the UBM.

22. The method of claim 20, wherein the step of forming the UBM on the active surface of the wafer comprises:

forming an adhesive layer on the active surface of the wafer;

forming a barrier layer out the adhesive layer; and forming a wettable layer on the barrier layer.

23. The method of claim 22, wherein the adhesive layer us formed of a material selected from a group of titanium, titanium tungsten alloy, aluminum, and chromium.

24. The method of claim 22, wherein the barrier layer is formed of a material selected from a group consisting of nickel vanadium alloy, chromium copper alloy, and nickel.

25. The method of claim 22, wherein the wettable layer is formed of a material selected from a group consisting of copper, palladium, and gold.

26. The method of claim 20, wherein the conductive stud is formed of leadless alloy.

27. The method of claim 20, wherein the conductive stud is formed of a material selected from a group consisting of tin copper alloy, tin silver alloy, tin magnesium alloy, tin zinc alloy, indium silver alloy, tin bismuth alloy, tin indium alloy, bismuth indium alloy, and tin.

28. The method of claim 20, wherein the conductive stud is formed of tin lead alloy.

29. The method of claim 20, wherein the conductive stud is formed of tin lead alloy with high lead percentage of more than 90%.

* * * * *